(12) United States Patent
Karinou et al.

(10) Patent No.: US 11,675,222 B2
(45) Date of Patent: Jun. 13, 2023

(54) MAGNETO-OPTICAL MODULATOR-BASED SYSTEM FOR TRANSFERRING QUANTUM INFORMATION

(71) Applicant: Microsoft Technology Licensing, LLC, Redmond, WA (US)

(72) Inventors: Foteini Karinou, Cambridge (GB); Winston Allen Saunders, Seattle, WA (US); Haidang Lin, Sunnyvale, CA (US); Richard P. Rouse, Kirkland, WA (US); Derek Leslie Knee, Fort Collins, CO (US); Charles Walter Boecker, Ames, IA (US); Marijn Petrus Gerardus Rombouts, Eindhoven (NL)

(73) Assignee: Microsoft Technology Licensing, LLC, Redmond, WA (US)

( * ) Notice: Subject to any disclaimer, the term of this patent is extended or adjusted under 35 U.S.C. 154(b) by 186 days.

(21) Appl. No.: 17/160,639

(22) Filed: Jan. 28, 2021

(65) Prior Publication Data
US 2022/0236593 A1 Jul. 28, 2022

(51) Int. Cl.
*G02F 1/095* (2006.01)
*G06N 10/00* (2022.01)
(Continued)

(52) U.S. Cl.
CPC .............. *G02F 1/095* (2013.01); *G02F 1/212* (2021.01); *G06N 10/00* (2019.01); *H10N 60/12* (2023.02); *H10N 60/805* (2023.02)

(58) Field of Classification Search
CPC ......... G06N 10/00; G02F 1/212; G02F 1/095; G02F 1/0955; G02F 1/09; H01L 39/025; H01L 39/223
See application file for complete search history.

(56) References Cited

U.S. PATENT DOCUMENTS 5,889,609 A 3/1999 Fukushima
6,476,956 B1 11/2002 Cottrell et al.
(Continued)

FOREIGN PATENT DOCUMENTS

CN 104820298 A 8/2015
WO 2018093545 A1 5/2018
WO 2019225445 A1 11/2019

OTHER PUBLICATIONS

Flaxer, Eli, "Implementing of a Precision Fast Thermoelectric Cooler Controller using a Personal Computer Parallel Port Connection and ADN8830 Controller", In Journal of Review of Scientific Instruments, vol. 74, Issue 8, Aug. 1, 2003, pp. 3862-3873.
(Continued)

*Primary Examiner* — Thomas A Hollweg
*Assistant Examiner* — Mary A El-Shammaa
(74) *Attorney, Agent, or Firm* — Ranjeev Singh; Singh Law, PLLC

(57) ABSTRACT

Magneto-optical modulator-based systems and devices for transferring quantum information are described. Such systems can be used for many applications, including as part of quantum computers. An example system includes a quantum information system configured to provide a signal corresponding to at least one qubit. The system further includes a magneto-optical driver configured to receive the signal corresponding to the at least one qubit and process the signal to generate a current based on the signal corresponding to the at least one qubit. The system further includes a magneto-optical modulator configured to receive the current
(Continued)

from the magneto-optical driver and provide a modulated light output by modulating a received light input based on the current.

20 Claims, 10 Drawing Sheets

(51) Int. Cl.
*G02F 1/21* (2006.01)
*H10N 60/12* (2023.01)
*H10N 60/80* (2023.01)

(56) References Cited

U.S. PATENT DOCUMENTS

| | | |
|---|---|---|
| 6,661,560 B1 | 12/2003 | Sobolewski |
| 6,912,080 B2 | 6/2005 | Minemoto |
| 10,097,281 B1 | 10/2018 | Vernik et al. |
| 10,644,809 B1 | 5/2020 | Vernik et al. |
| 2016/0352515 A1 | 12/2016 | Bunandar et al. |
| 2018/0330266 A1 | 11/2018 | Simmons et al. |
| 2019/0372589 A1 | 12/2019 | Gould et al. |

OTHER PUBLICATIONS

Jiang, et al., "Efficient Bidirectional Piezo-Optomechanical Transduction between Microwave and Optical Frequency", in Proceedings of Conference on Lasers and Electro-Optics, May 10, 2020, 2 Pages.

Lambert, et al., "Coherent Conversion between Microwave and Optical Photons—An Overview of Physical Implementations", in Repository of arXiv:1906.10255v1, Jun. 24, 2019, pp. 1-17.

"International Search Report and Written Opinion Issued in PCT Application No. PCT/US21/064766", dated Apr. 22, 2022, 12 Pages.

Shastri, et al., "Photonics for Artificial Intelligence and Neuromorphic Computing", in Repository of arXiv:2011.00111v1, Oct. 30, 2020, 26 Pages.

Xie, et al., "Thermally-Reconfigurable Silicon Photonic Devices and Circuits", in Journal of Selected Topics in Quantum Electronics, vol. 26, Issue 5, Sep. 2020, 20 Pages.

Youssefi, et al., "Cryogenic Electro-Optic Interconnect for Superconducting Devices", in Repository of arXiv:2004.04705v2, Sep. 11, 2020, 10 Pages.

Sobolewski, et al., "Magneto-Optical Modulator for Superconducting Digital Output Interface", in Journal of IEEE Transactions on Applied Superconductivity, vol. 11, Issue 1, Mar. 2001, pp. 727-730.

MAGNETO-OPTICAL MODULATOR-BASED SYSTEM FOR TRANSFERRING QUANTUM INFORMATION

BACKGROUND

In computing and communication systems, coaxial cables or other such interconnection mechanisms are used to transfer quantum information, such as qubits, from the colder temperature environment to the room temperature environment. Such interconnection mechanisms use copper or other metallic conductors. Apart from lower thermal efficiency, such interconnection mechanisms also suffer from cross-talk among neighboring wires. In addition, the bandwidth of such interconnection mechanisms may not be sufficient for transferring large amounts of quantum information. Accordingly, there is a need for better interconnection systems and methods for transferring quantum information.

SUMMARY

In one aspect, the present disclosure relates to a system including a quantum information system configured to provide a signal corresponding to at least one qubit. The system may further include a magneto-optical driver configured to receive the signal corresponding to the at least one qubit and process the signal to generate a current based on the signal corresponding to the at least one qubit. The system may further include a magneto-optical modulator configured to receive the current from the magneto-optical driver and provide a modulated light output by modulating a received light input based on the current.

In another aspect, the present disclosure relates to a system including a quantum information system configured to provide a signal corresponding to at least one qubit, where the quantum information system is configured to operate at a temperature below 6 Kelvin and in an environment having a low pressure in a range between $10^{-3}$ Torr to $10^{-10}$ Torr. The system may further include a magneto-optical driver configured to receive the signal corresponding to at least one qubit and process the signal to generate a current based on the signal corresponding to the at least one qubit. The system may further include a magneto-optical modulator configured to receive the current from the magneto-optical driver and provide a modulated light output by modulating a received light input based on the current. The system may further include a light detector coupled to receive the modulated light output.

In yet another aspect, the present disclosure relates to a system including a magneto-optical driver configured to receive a signal corresponding to at least one qubit and process the signal to generate a current based on the signal corresponding to the at least one qubit. The system may further include a magneto-optical modulator configured to receive the current from the magneto-optical driver and provide a modulated light output by modulating a received light input based on the current. The system may further include a light detector coupled to receive the modulated light output.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Examples disclosed in the present disclosure relate to a magneto-optical modulator-based system and related methods. Certain examples also relate to systems for transferring quantum information (e.g., qubits) using the magneto-optical modulator-based system. Certain examples of the present disclosure seek to address some of the limitations associated with the previously developed qubit transfer systems. Although an application of the magneto-optical modulator concerns the transferring of qubits in a quantum computer, the magneto-optical modulator may be used as part of the systems included in radio astronomy, communications and satellite receiver systems, Wi-Fi systems, radar systems, and other tele-communications (e.g., 5G or 6G cellular systems) and defense applications. Such systems may be operated at room temperature, in cryogenic environments, or the sub-systems may be distributed as explained later.

Figure 1:
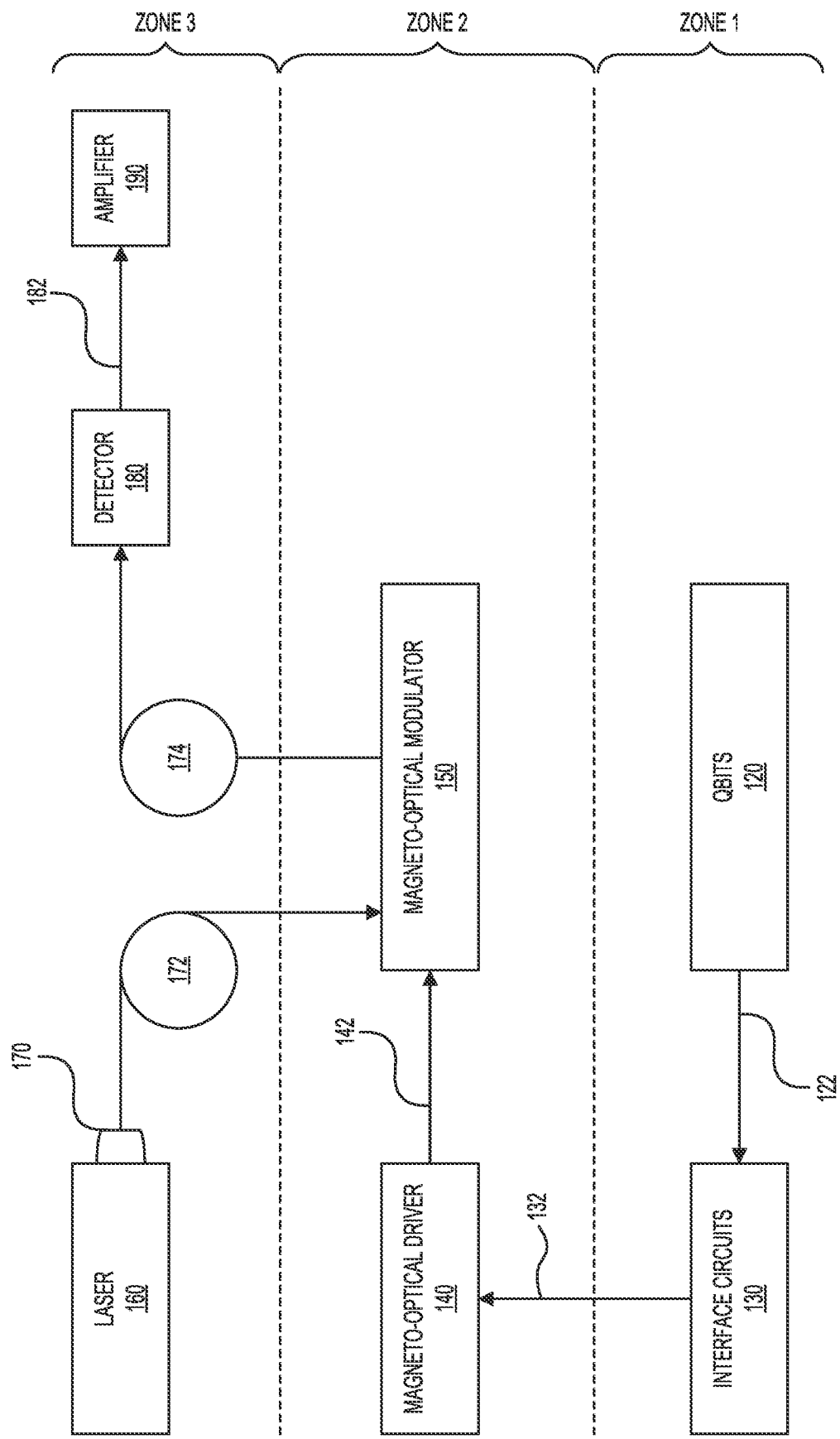
FIG. 1 shows a magneto-optical modulator-based system in accordance with one example.

FIG. 1 shows a magneto-optical modulator-based system 100 in accordance with one example. In this example, magneto-optical modulator-based system 100 may be used to transfer quantum information stored as qubits 120. Magneto-optical modulator-based system 100 may further include interface circuits 130, a magneto-optical driver 140, a magneto-optical modulator 150, a laser 160, a coupler 170, a detector 180, and an amplifier 190. Qubits may be implemented using topological computing gates that may operate at approximately 20 milli-Kelvin (~20 mK). A qubit may be implemented using various physical systems, including photons, electrons, Josephson junctions, quantum dots, or heterostructures. The quantum state(s) may be encoded as a direction of spin, another aspect of spin, charge, energy, or excitation stages as part of a qubit, or a topological phase of superconducting matter. The example qubits may operate based on either low-frequency DC signals (e.g., bias currents) or high-frequency radio frequency signals (e.g., 10 GHz signals), or based on a combination of both. In certain examples, microwave signals may be used to control the superconducting devices, including, for example, the state of the quantum bits (qubits). Certain implementations of the gates for quantum bits (qubits) may require high-frequency microwave signals. In addition, in one example, the qubits may be configured to operate in a cryogenic environment (e.g., in a vacuum and at a temperature from a few milli-Kelvins to 6 Kelvin). In one example, a vacuum may relate to a pressure in a range of $10^{-3}$ Torr to $10^{-10}$ Torr. It is to be recognized that the temperature ranges referred to herein relate to the temperature of the environment in which the qubits are operating and not the temperature of the qubits themselves. Thus, references such as "operating at" or "maintained at" refer to the temperature of the environment in which these components are operating or are being maintained inside a housing.

With continued reference to FIG. 1, quantum information stored as part of qubits 120 may be transferred via interconnect 122 to interface circuits 130. In this example, the combination of qubits 120, interconnect 122, and interface circuit 130 may comprise a quantum information system. As explained earlier, example qubits may operate based on either low-frequency DC signals (e.g., bias currents) or high-frequency radio frequency signals (e.g., 10 GHz signals), or based on a combination of both. Interface circuits 130, which may be implemented as radio frequency interface circuits, may receive state information concerning qubits 120. The output of interface circuits 130 may be provided via interconnect 132 to magneto-optical driver 140. The output of magneto-optical driver 140 may be provided to magneto-optical modulator 150 via interconnect 142. Laser 160 may generate light, which may be coupled via coupler 170 to photonic interconnect 172, and photonic interconnect 172 may couple the input light to magneto-optical modulator 150. Magneto-optical modulator 150 may further be coupled via photonic interconnect 174 to detector 180, which may further be coupled via interconnect 182 to amplifier 190.

Still referring to FIG. 1, magneto-optical driver 140 may receive the signals corresponding to quantum information (e.g., qubits 120) via interface circuits 130. Magneto-optical driver 140 may be configured to generate a modulation signal for magneto-optical modulator 150. As described later, magneto-optical driver 140 may be implemented in several different ways (e.g., example drivers shown in FIG. 5, FIG. 6, FIG. 7, and FIG. 8). In each of these instances, magneto-optical driver 140 may be configured to drive a modulation signal via a coil, or a similar structure, which in turn may couple the current corresponding to the modulation signal to a layer of a magneto-optical material included as part of magneto-optical modulator 150. This current may create a magnetic field that may change an optical property (e.g., an index of refraction of the material) of the magneto-optical material. The interaction between the light input to magneto-optical modulator 150, traveling via a waveguide associated with magneto-optical modulator 150, and the change in the optical property of the magneto-optical material may in turn change an aspect of the light propagating through the waveguide. In one example, the aspect of the light that changes may correspond to the intensity of the light. Alternatively, the aspect of the light that changes may be a phase of the light, an orientation of the light, a polarization of the light, or another property of the light. The modulated light output by magneto-optical modulator 150 may be detected using detector 180. The detected signal may further be amplified using amplifier 190 prior to storage or other processing.

With continued reference to FIG. 1, in one example, the components associated with magneto-optical modular-based system 100 may be associated with different operating zones. Each zone may have an associated range of temperature and a lower pressure, as needed. In one example, ZONE 1 may include qubits 120 and interface circuits 130. The temperature of the cold environment for ZONE 1 may be in a range between approximately zero Kelvin to 6 Kelvin. Example temperatures include 25 milli-Kevin, 100 milli-Kelvin, or other temperatures up to 6 Kelvin. In addition, ZONE 1 may have a low pressure corresponding to a vacuum having a pressure in a range between $10^{-3}$ Torr to $10^{-10}$ Torr. In one example, ZONE 2 may include magneto-optical driver 140 and magneto-optical modulator 150. Depending on the implementation used for magneto-optical driver 140, the temperature and the pressure associated with ZONE 2 may completely or partially overlap with ZONE 1. Thus, in one example, the temperature of ZONE 1 may be in a range between approximately zero Kelvin to 6 Kelvin and the pressure may be in a range between $10^{-3}$ Torr to $10^{-10}$ Torr. Alternatively, ZONE 2 may have a temperature in a range between 1 Kelvin to 6 Kelvin. In one example, ZONE 3 may include laser 160, detector 180, and amplifier 190. In this example, the temperature of ZONE 3 may correspond to room temperature (e.g., in a range between 273 Kelvin to 323 Kelvin). Although FIG. 1 shows a certain number of components of magneto-optical modulator-based system 100, it may further include additional or fewer components arranged differently. As an example, instead of ZONE 1, ZONE 2 may include interface circuits 130.

Figure 2:
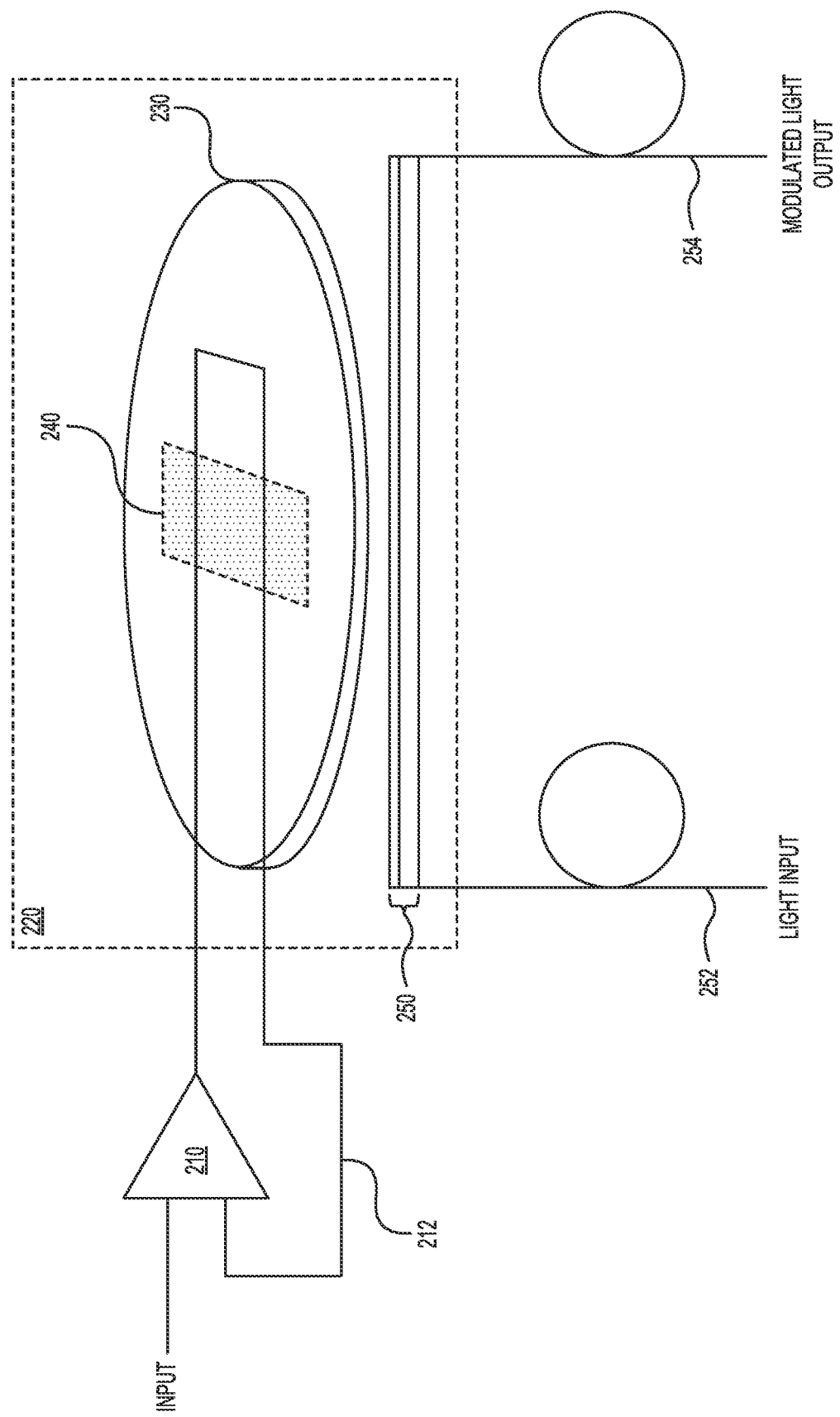
FIG. 2 shows a magneto-optical modulation system in accordance with one example.

FIG. 2 shows a magneto-optical modulation system 200 in accordance with one example. In one example, magneto-optical modulation system 200 may include a magneto-optical driver 210, a magneto-optical modulator 220, and photonic interconnects 252 and 254. In one example, magneto-optical modulator 220 may be used to implement magneto-optical modulator 150 of FIG. 1. Magneto-optical modulator 220 may include a modulator structure 230 having a magneto-optical material layer 240 and a waveguide 250. Modulator structure 230 may be implemented as an interferometric structure like Mach-Zehnder Interferometers (MZIs) or Micro-Ring Resonators (MRRs). Example magneto-optical materials used for implementing magneto-optical material layer 240 include, but are not limited to, terbium gallium garnet (TGG), yttrium iron garnet, grown with cerium (Ce:YIG), yttrium iron garnet, grown with bismuth (Bi:YIG), europium sulfide (EuS), and nanoscopic structures. Magneto-optical driver 210 may be configured to drive a modulation signal via a conductor 212 (e.g., a coil, a stripe, or a similar structure), which in turn may couple the current corresponding to the modulation signal to magneto-optical material layer 240 included as part of magneto-optical modulator 220. This current may create a magnetic field that may change an optical property (e.g., an index of refraction of the material) of the magneto-optical material. The interaction between the light input to magneto-optical modulator 150, traveling via a waveguide associated with magneto-optical modulator 150, and the change in the optical property of the magneto-optical material may in turn change an aspect of the light propagating through the waveguide. In one example, the aspect of the light that changes may correspond to the intensity of the light. Alternatively, the aspect of the light that changes may be a phase of the light, an orientation of the light, a polarization of the light, or another property of the light.

With continued reference to FIG. 2, either Faraday effect or non-reciprocal phase shift (NRPS) may be used to realize the magneto-optic effect using magneto-optical modulator 220. With respect to the Faraday effect, when a magnetic field is applied to the magneto-optic material in a parallel fashion with respect to the propagation direction of the light, the polarization of the light is rotated. Linear polarized light can be seen as consisting of right and left circularly polarized waves, which are superimposed to appear as a linearly polarized wave. The presence of the magnetic field increases the rotation speed of either of the two circular polarizations and decreases the rotation speed of the other. Given its superposition, the observed linearly polarized light appears to have rotated. The material specific Verdet constant (V) determines the strength of this effect. The Verdet constant is linearly related to the observed angle of rotation (P) in radians, the magnetic flux density (B) in Teslas and the length of the waveguide (d) in meters: θ=VBd. By inserting a polarization filter after the magneto-optic waveguide, light can be attenuated or transmitted depending on the amount of polarization rotation. In this way, light can be modulated by actively changing the magnetic field back and forth, or by changing the intensity of the magnetic field.

The non-reciprocal phase shift effect occurs when the magnetic field is oriented perpendicular to the direction of propagation in combination with transverse magnetic waves (TM). The presence of the magnetic field induces a phase shift, where the direction of the change is related to the orientation of the magnetic field. Although FIG. 2 shows a certain number of components of magneto-optical modulation system 200, it may further include additional or fewer components arranged differently.

Figure 3:
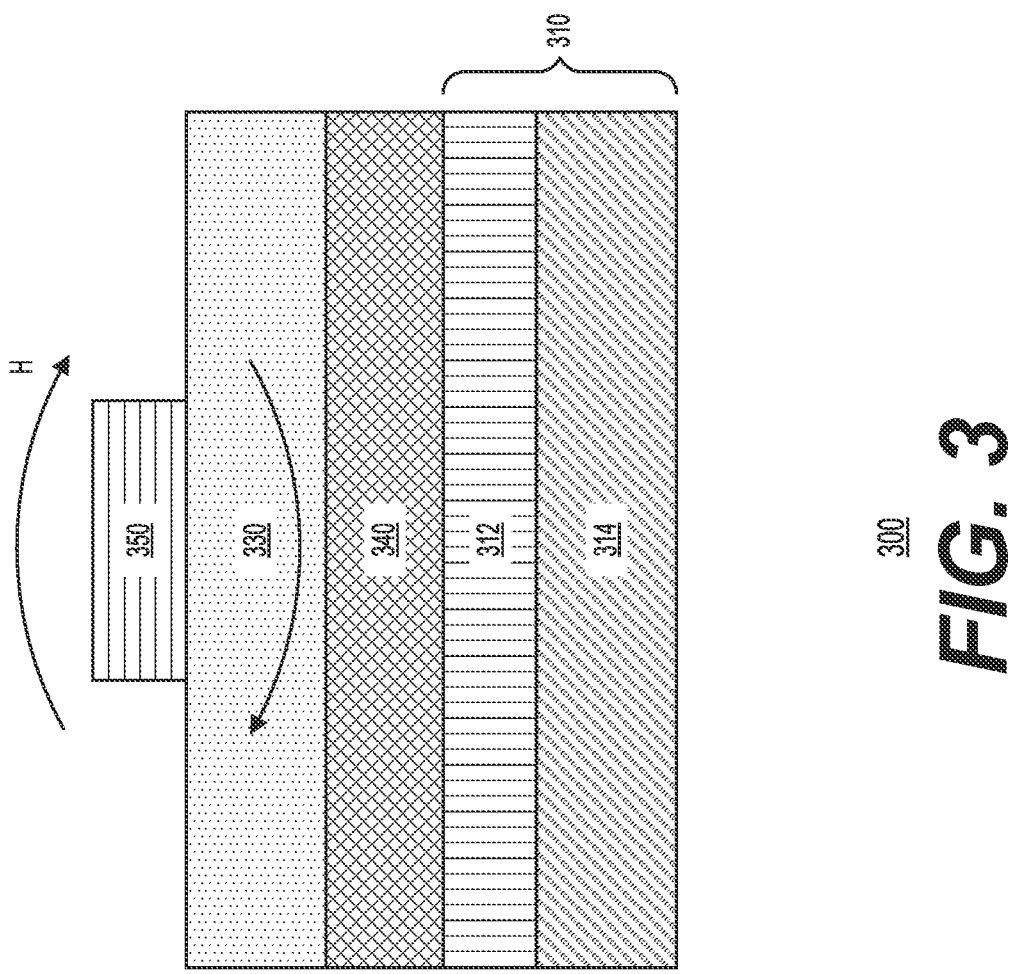
FIG. 3 shows a cross-section view of an arrangement of layers for use as part of a magneto-optical modulator in accordance with one example.

FIG. 3 shows a cross-section view 300 of an arrangement of layers for use as part of a magneto-optical modulator (e.g., magneto-optical modulator 220 of FIG. 2) in accordance with one example. In this example, the magneto-optical modulator may include a silicon waveguide 310 die-bonded to a magneto-optical material layer 340. Silicon waveguide 310 may be formed using silicon 312 with a silicon-on-insulator (SOI) substrate 314. Prior to the die-bonding, the magneto-optical material layer 340 is deposited on a surface of a substrate 330 and a conductor 350 is deposited on the opposite surface of substrate 330. In this example, substrate 330 is thinned down to minimize a distance between conductor 350 and silicon waveguide 310 to ensure a stronger magnetic effect. In this example, the material used to form magneto-optical material layer 340 comprises yttrium iron garnet, grown with cerium (Ce:YIG). In this example, the material used to form substrate 330 may be gadolinium gallium garnet (SGGG) due to lattice matching with YIG, but depending on material used to form magneto-optical material layer 340 other materials for substrate 330 may be used. Moreover, in this example, conductor 350 may be a gold (Au) conductor that may be used to carry the current provided a magneto-optical driver. The magnetic field (H) applied to the light propagating through silicon waveguide 310 may be oriented in a perpendicular direction to a direction of the propagation of the light through silicon waveguide 310. Although FIG. 3 shows a certain number of layers of magneto-optical modulator 200 arranged in a certain manner, there could be more, or fewer numbers of layers arranged differently. Similarly, although FIG. 3 describes certain materials associated with the magneto-optical modulator, other materials may also be used. As an example, the material used to form magneto-optical material layer 340 may include other materials, such as terbium gallium garnet (TGG), yttrium iron garnet, grown with bismuth (Bi:YIG), europium sulfide (EuS), and nanoscopic structures. As another example, other materials may be used to form silicon waveguide 310 and to form conductor 350. In one example, conductor 350 may be formed using niobium or another superconducting material.

Figure 4:
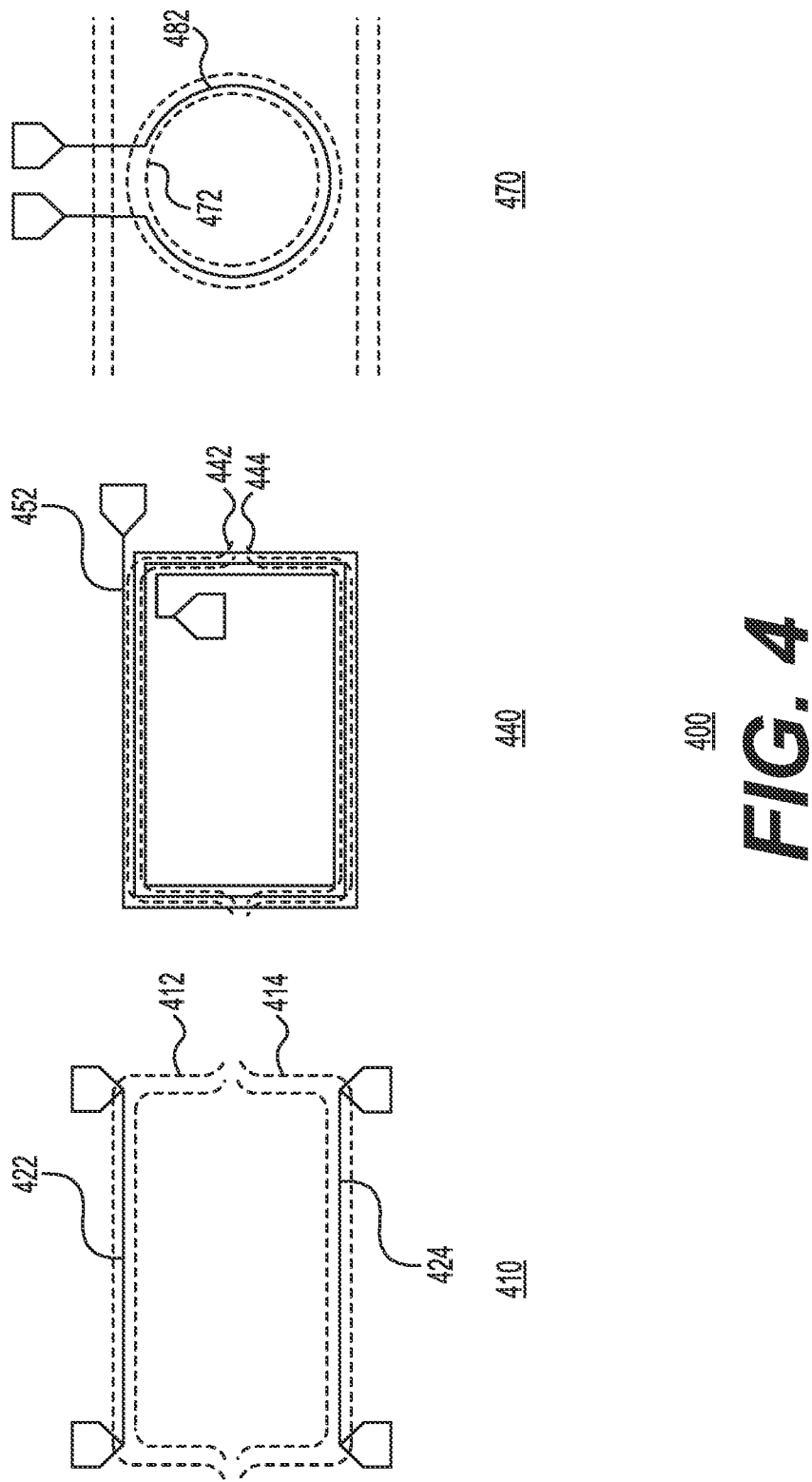
FIG. 4 shows geometrical shapes of electromagnets and corresponding waveguides for use as part of a magneto-optical modulator in accordance with one example.

FIG. 4 shows a top view 400 of geometrical shapes of electromagnets and corresponding waveguides for use as a modulator structure (e.g., modulator structure 230 of FIG. 2) in accordance with one example. As explained earlier, the modulator structure may be implemented as an interferometric structure like Mach-Zehnder Interferometers (MZIs) or Micro-Ring Resonators (MRRs). Top views 410 and 440 correspond to MZI waveguide structures and top view 470 corresponds to an MRR waveguide structure. Top view 410 shows two arms (arm 412 and arm 414) of an MZI waveguide structure. Top view 410 further shows a conductive microstrip 422 placed above arm 412 of the MZI structure and another conductive microstrip 422 placed above arm 414 of the MZI structure. Top view 440 shows two arms (arm 442 and arm 444) of an another MZI waveguide structure and a single conductive microstrip 452 placed on both arms of the MZI waveguide structure. Top view 470 shows a waveguide ring 472 corresponding to an MRR waveguide structure and a circular loop 482 corresponding to the conductive microstrip. Each of the arrangements of the conductive microstrips and the waveguides shown in FIG. 4 ensure that the magnetic field is perpendicular to the direction of propagation of light in the underlying waveguides. Although FIG. 4 shows top views of certain shapes of waveguides and corresponding conductive strips, other shapes and arrangements may also be used.

As explained earlier, a magneto-optical driver (e.g., magneto-optical driver 140 of FIG. 1) may be configured to generate a modulation signal for the magneto-optical modulator (e.g., magneto-optical modulator 150 of FIG. 1). In one example, the magneto-optical driver may be implemented as a superconducting driver. In superconducting electronics, the logic signals may be represented with single-flux quantum (SFQ) pulses. These SFQ pulses are similar in shape to mathematical Gaussian pulses with peak amplitudes in the 1-2 mV range and durations in the 1-2 ps. Due to magnetic flux quantization, SFQ pulses may have a quantized area relating to: $\int V(t) dt = \Phi_o := 2.0679$ mApH=2.0679 mVps=$2.0679 \times 10^{-15}$ Wb.

Logic signals can be represented with both positive and negative SFQ pulses such as in Reciprocating Quantum Logic (RQL) implementation or with a single polarity SFQ pulses such as in Rapid Single Flux Quantum (RSFQ) logic implementation. In either case, the frequency spectrum represented by these Gaussian pules extends to the 600 GHz range. The energy contained within a single SFQ pulse is limited to Ic$\Phi$, and therefore the ability to drive an inductive load with a steady current is limited. The relationship between the quantum phase across a Josephson Junction, JJ, and the resulting current that can be generated through an inductor in parallel with this phase is:

$$\varphi(t) = \frac{2\pi}{\Phi_o} L \cdot i(t),$$

where $\varphi(t)$ is the phase across the inductor L and $i(t)$ is the current through the inductor. Certain example magneto-optical drivers described herein use multiple SFQ pulses in the output driver circuit to be able to drive larger load inductors with higher current as required by the properties of the magneto-optical material and any other electro-optical implementation trade-offs. The output load inductor (e.g., conductor 350 of FIG. 3) is used to create the magnetic field which is placed in close proximity to the magneto-optical material thus allowing modulation of the optical signal coupled to the magneto-optical material. Advantageously, the only power that is dissipated in the superconducting drivers occurs during the fast-switching time of the Josephson junctions (JJ) where the device momentarily appears resistive. There are no other resistors in the signal paths due to the use of superconductive materials and the below 6 Kelvin temperature operating range. In addition, the output current in the load inductor used to generate the magnetic field is persistent. Due to the use of superconductors to implement the coil or the inductor loop, there is no resistance in the loop to dissipate energy and reduce the current nor is there any need to supply a sustaining electromotive force to maintain this current.

Figure 5:
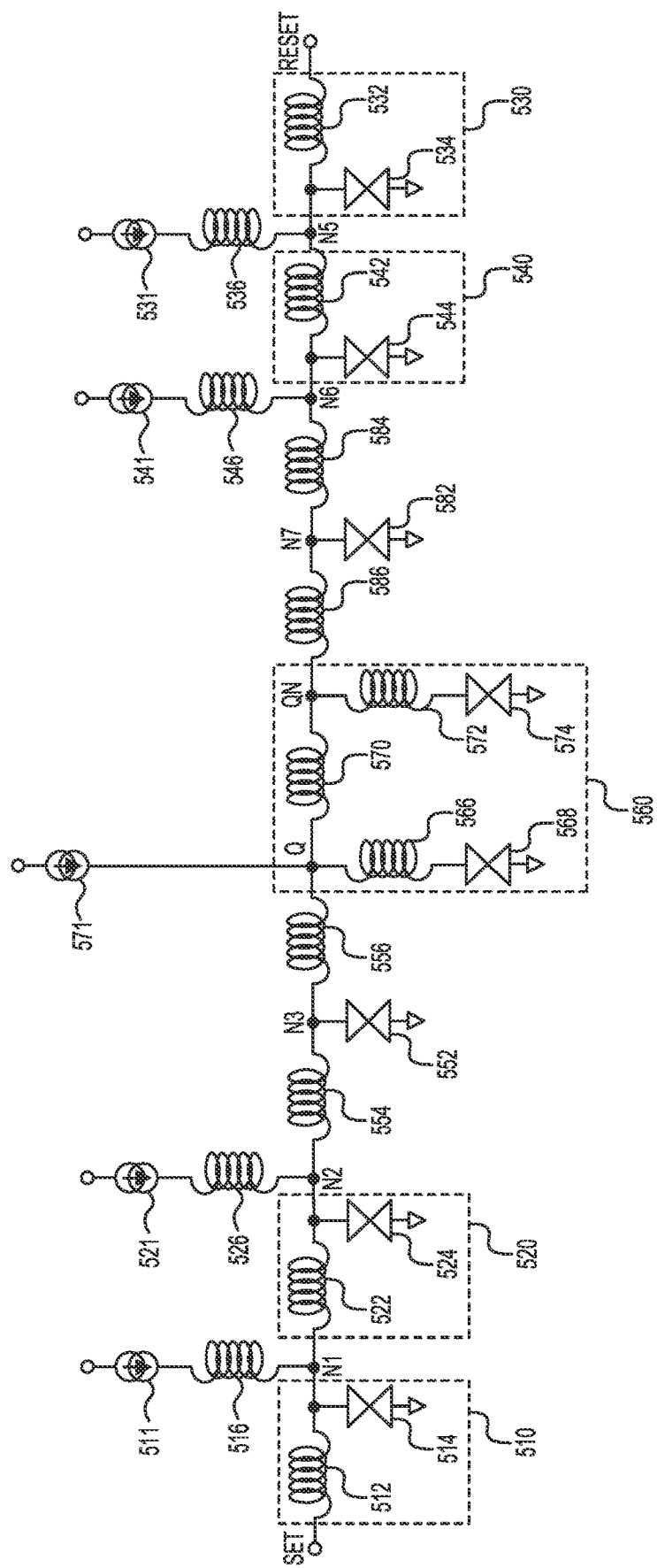
FIG. 5 shows a schematic of a DC-powered magneto-optical driver in accordance with one example.

FIG. 5 shows a schematic of a DC-powered magneto-optical driver 500 in accordance with one example. In this example, DC-powered magneto-optical driver 500 is based on a state-based design in which SET and RESET SFQ signal paths may determine when the output current through the coil carrying the modulation signal is enabled or disabled. In this example, the SET path may include the path from the SET terminal to node Q and the RESET path may include the path from the RESET terminal to node QN. The output stage may be coupled between node Q and node QN. The SET path may include a first half-JTL stage 510 and a second half-JTL stage 520. Half-JTL stage 510 may be coupled between the SET terminal and node N1. Half-JTL stage 510 may include an inductor 512 and a damped Josephson junction (JJ) 514. A DC current source 511 may also be coupled to node N1 via an inductor 516. Half-JTL stage 520 may be coupled between the node N1 and node N2. Half-JTL stage 520 may include an inductor 522 and a damped JJ 524. A DC current source 521 may also be coupled to node N2 via an inductor 526. Half-JTL stage 520 may be coupled via inductor 554 to node N3. A damped JJ 552 may be coupled between node N3 and the ground terminal. Node N3 may be coupled via an inductor 556 to node Q.

With continued reference to FIG. 5, in this example, the RESET path may also include a first half-JTL stage 530 and a second half-JTL stage 540. Half-JTL stage 530 may be coupled between the RESET terminal and node N5. Half-JTL stage 530 may include an inductor 532 and a damped JJ 534. A DC current source 531 may also be coupled to node N5 via an inductor 536. Half-JTL stage 540 may be coupled between the node N5 and node N6. Half-JTL stage 540 may include an inductor 542 and a damped JJ 544. A DC current source 541 may also be coupled to node N6 via an inductor 546. Half-JTL stage 540 may be coupled via inductor 584 to node N7. A damped JJ 582 may be coupled between node N7 and the ground terminal. Node N7 may be coupled via an inductor 586 to node QN.

Still referring to FIG. 5, an output stage 560 may be coupled between node and node QN. Output stage 560 may include an inductive coil 570 and a DC-superconducting quantum interference device (SQUID) coupled to another DC current source 571. The DC-SQUID may be implemented using a parallel combination of damped JJ 568 and damped JJ 574. Damped JJ 568 may be coupled via inductor 566 to node Q and damped JJ 574 may be coupled via inductor 572 to node QN. The state of the output current flowing through inductive coil 570 may be "held" in the DC-SQUID. The magnitude of the output current may be limited by an inductance associated with inductive coil 570. In one example, assuming an inductance of 20 picohenry (pH) for inductive coil 570, the current flowing through inductive coil 570 may switch from approximately 0 microamperes (μA) to 100 μA. In this example, the buffered SFQ pulse arriving at the node Q will cause a current to flow in the DC_SQUID in output stage 560, such that an integer number of flux quanta is maintained in the DC-SQUID. The buffered SFQ pulse arriving at node QN will have the opposite effect and cancel this current. The current looping in the DC-SQUID, passes through inductive coil 570 which creates the magnetic flux. The current in the coil (e.g., inductive coil 570) of DC-powered magneto-optical driver 500 may be coupled to a layer of a magneto-optical material included as part of a magneto-optical modulator (e.g., magneto-optical modulator 150 of FIG. 1). Although FIG. 5 shows DC-powered magneto-optical driver 500 as including a certain number of components arranged in a certain manner, DC-powered magneto-optical driver 500 may include additional or fewer components arranged differently.

Figure 6:
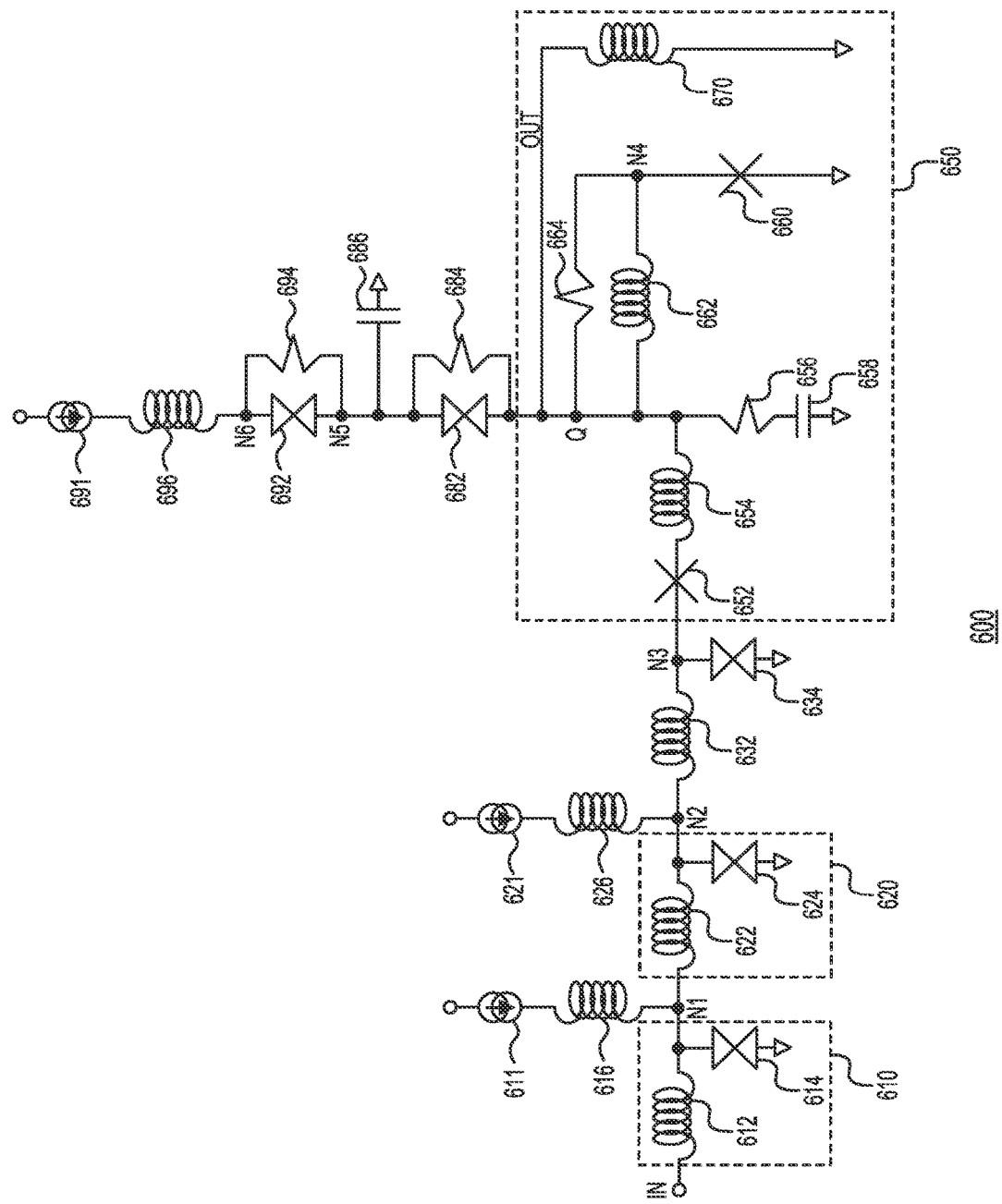
FIG. 6 shows a schematic of an AC-powered magneto-optical driver in accordance with one example.

FIG. 6 shows a schematic of an AC-powered magneto-optical driver 600 in accordance with one example. In this example, AC-powered magneto-optical driver 600 may include two DC-biased half-JTL stages 610 and 620 coupled to an output stage 650. The DC-biased half-JTL stages 610 and 620 may be configured to increase the power of the signal received via the input terminal (IN) of AC-powered magneto-optical driver 600. Half-JTL stage 610 may be coupled between the input terminal (IN) and node N1. Half-JTL stage 610 may include an inductor 612 and a damped Josephson junction (JJ) 614. A DC current source 611 may also be coupled to node N1 via an inductor 616. Half-JTL stage 620 may be coupled between the node N1 and node N2. Half-JTL stage 620 may include an inductor 622 and a damped JJ 624. A DC current source 621 may also be coupled to node N2 via an inductor 626. Half-JTL stage 620 may be coupled via inductor 632 to node N3. A damped JJ 634 may be coupled between node N3 and the ground terminal.

With continued reference to FIG. 6, output stage 650 may be coupled to node N3. Output stage may include a Josephson junction 652 coupled to node Q via an inductor 654. Output stage 650 may include another Josephson junction 660 coupled between node N4 and the ground terminal. An inductor 662 is coupled between node Q and node N4. The parallel combination of JJ 652 and JJ 660 creates a DC-SQUID, which may be triggered when enough SFQ power is generated by half-JTL stages 610 and 620 to trigger damped JJ 634. The DC-SQUID may further comprise damping circuitry, including: (1) a resistor 656 in series with a capacitor 658 that are arranged between node Q and the ground terminal, (2) an inductor 662, and (3) a resistor 664 arranged in parallel to inductor 662. Output stage 650 may further include an inductive coil 670 that is configured to carry the current generated by the triggering of the DC-SQUID. In this example, JJ 652 and JJ 660 are undamped JJs, which will oscillate as part of the DC-SQUID at about 400 GHz until the damping circuitry stops this oscillation. In this example, the damping time constant is designed to allow eight to ten oscillation cycles to occur. The components and the values of the components in the damping circuitry are selected to control the number of oscillations in the DC-SQUID. In this example, each oscillation of the DC-SQUID adds $2*\pi$ radians of phase signal drive current to node Q. This current is in turn arranged to flow through inductive coil 670. The current in the coil (e.g., inductive coil 670) of AC-powered magneto-optical driver 600 may be coupled to a layer of a magneto-optical material included as part of a magneto-optical modulator (e.g., magneto-optical modulator 150 of FIG. 1).

AC-powered magneto-optical driver 600 may further include additional circuitry for the proper biasing of the DC-SQUID. In this example, the DC-SQUID may be biased using an AC current source 691 coupled to node N6 via an inductor 696. The peaks of the AC bias waveform may be "flattened" using additional circuitry coupled between node N6 and node Q. In this example, a damped JJ 682 and a resistor 684 may be arranged in parallel and may be coupled between node Q and node N5. A capacitor 686 may be coupled between node N5 and the ground terminal. In addition, as part of the damping circuitry, a damped JJ 692 and a resistor 694 may be arranged in parallel and may be coupled between node N5 and node N6.

In this example, the output current in AC-powered magneto-optical driver 600 is a bipolar current with a magnitude that is a function of the inductance load of inductive coil 670. In one example, assuming an inductance of 180 picohenry (pH) for inductive coil 670, the output current flowing through inductive coil 670 may oscillate between +65 microamperes (μA) to −65 μA. In another example, assuming an inductance of 270 picohenry (pH) for inductive coil 670, the output current flowing through inductive coil 670 may oscillate between +45 μA to −45 μA. Since, in this example, the DC-SQUID is allowed to oscillate for eight to ten cycles, the resultant output phase signal at node Q is accumulated up to 200*T, which allows for larger output inductances to be driven at higher current levels when compared to DC-powered magneto-optical driver 500 described with respect to FIG. 5. Although FIG. 6 shows AC-powered magneto-optical driver 600 as including a certain number of components arranged in a certain manner, AC-powered magneto-optical driver 600 may include additional or fewer components arranged differently.

Figure 7:
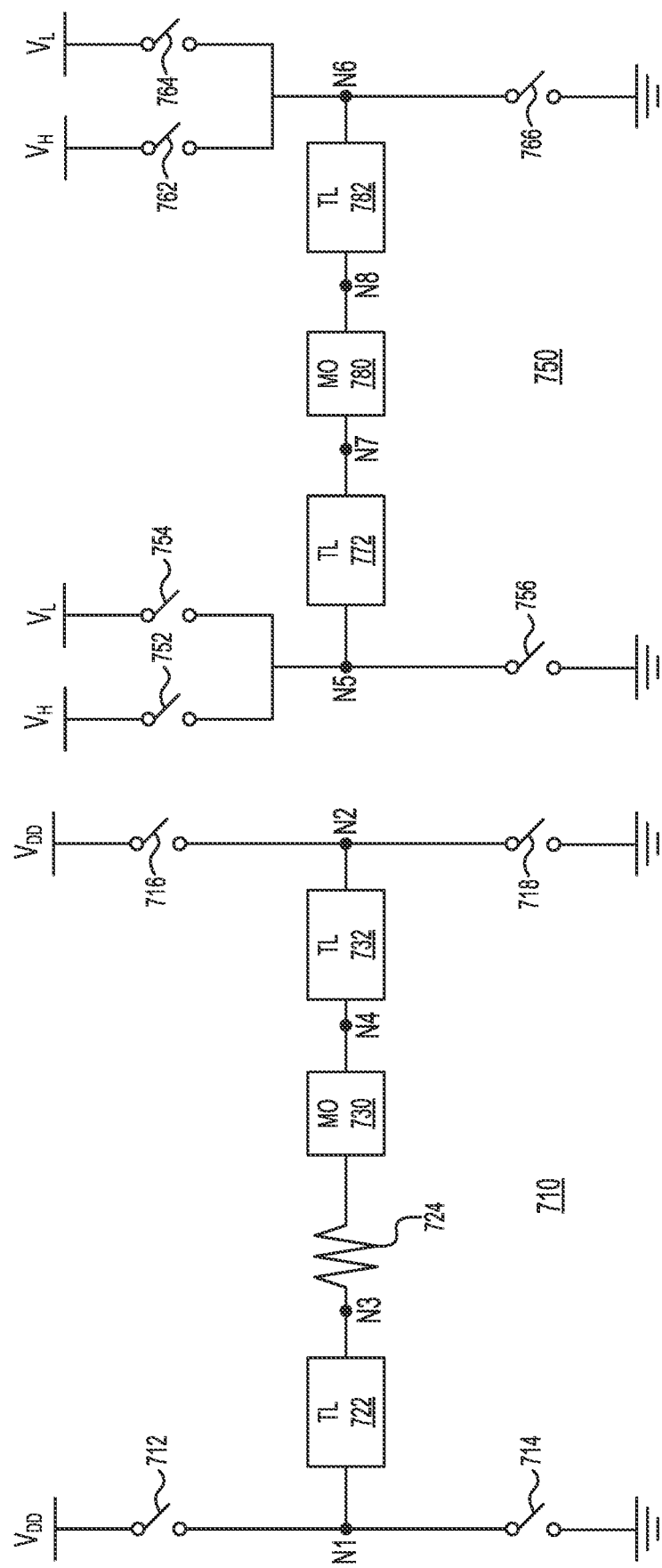
FIG. 7 shows schematics of two examples of a full-bridge magneto-optical driver.

FIG. 7 shows schematics of two examples of a full-bridge magneto-optical driver. Full-bridge magneto-optical driver A 710 may include a voltage supply ($V_{DD}$) coupled to a node N1 via a switch 712. Node N1 may further be coupled to the ground terminal via a switch 714. Full-bridge magneto-optical driver A 710 may include the voltage supply ($V_{DD}$) coupled to a node N2 via a switch 716. Node N2 may further be coupled to the ground terminal via a switch 718. A transmission line (TL) 722 may be coupled between node N1 and node N3. Another transmission line (TL) 732 may be coupled between node N2 and node N4. A resistor 724 and a modulator (MO) 730 may be coupled in series between node N3 and node N4. In this example, each of the transmission lines models the presence of the modulator connection to the driver. By opening and closing the switches the supply voltage ($V_{DD}$) may be switched back and forth. Thus, when switches 712 and 718 are closed, but switches 714 and 716 are open, the supply voltage ($V_{DD}$) may be applied to MO 730 via node N3. Alternatively, when switches 714 and 716 are closed, but switches 712 and 718 are open, the supply voltage ($V_{DD}$) may be applied to MO 730 via node N4. As the voltage is switched back and forth over the modulator, the current follows exponentially. The current may be coupled to a layer of a magneto-optical material included as part of MO 730 to provide similar functionality as magneto-optical modulator 150 of FIG. 1.

With continued reference to FIG. 7, full-bridge magneto-optical driver B 750 may further improve the functionality of full-bridge magneto-optical driver A 710 by mimicking a current source by using two voltages to excite the inductor in a controlled way. Full-bridge magneto-optical driver B 750 may include a high voltage supply ($V_H$) coupled to a node N5 via a switch 752 and a low voltage supply ($V_L$) coupled to the node N5 via a switch 756. Node N5 may further be coupled to the ground terminal via a switch 754. Full-bridge magneto-optical driver B 750 may further include the high voltage supply ($V_{DD}$) coupled to a node N6 via a switch 762 and a low voltage supply ($V_L$) coupled to the node N6 via a switch 764. Node N6 may further be coupled to the ground terminal via a switch 766. A transmission line (TL) 772 may be coupled between node N5 and node N7. Another transmission line (TL) 782 may be coupled between node N6 and node N8. A modulator (MO) 780 may be coupled between node N7 and node N8. In this example, each of the transmission lines models the presence of the modulator connection to the driver. By opening and closing the switches in a controlled manner, the high and low voltage supplies may mimic a current source. The current may be coupled to a layer of a magneto-optical material included as part of MO 780 to provide similar functionality as magneto-optical modulator 150 of FIG. 1. Although FIG. 7 shows full-bridge magneto-optical drivers 710 and 750 as including a certain number of components arranged in a certain manner, each of these drivers may include additional or fewer components arranged differently.

Figure 8:
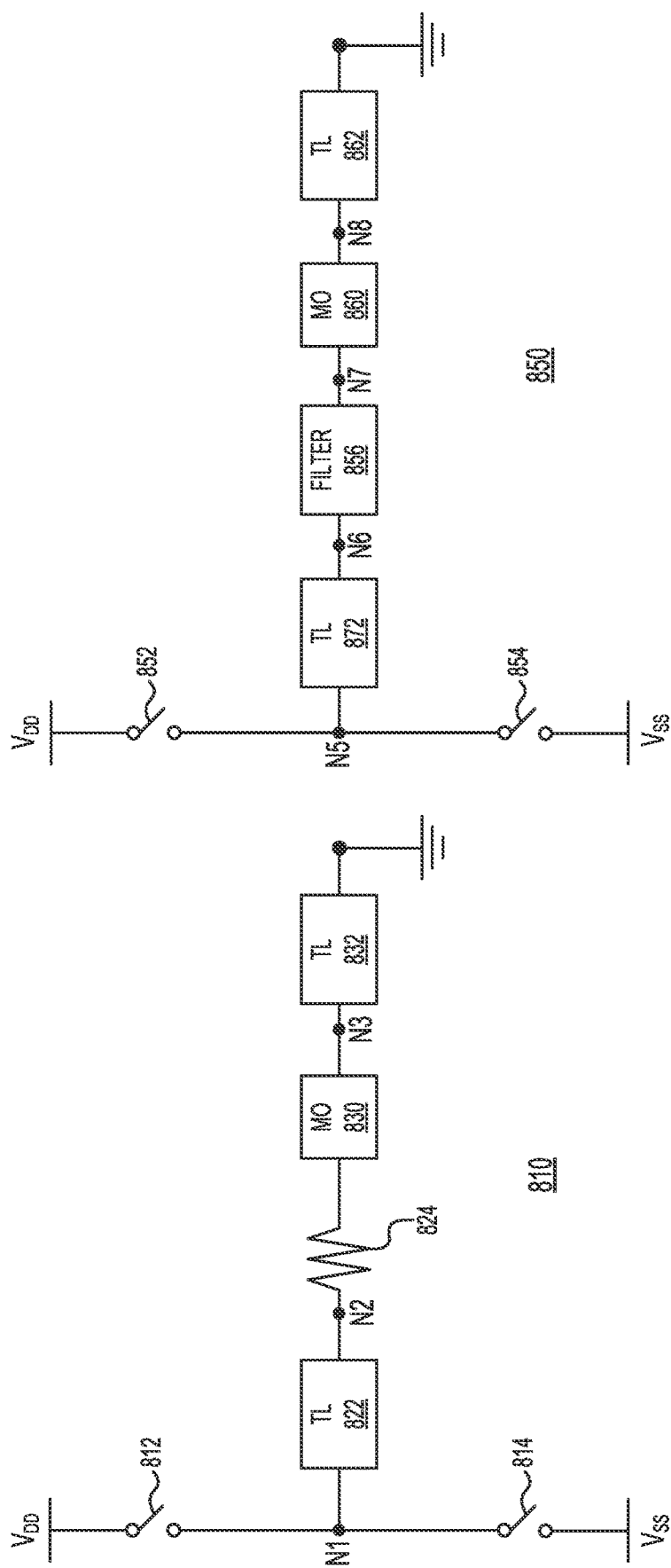
FIG. 8 shows schematics of two examples of a half-bridge magneto-optical driver for use as part of a magneto-optical modulator.

FIG. 8 shows schematics of two examples of a half-bridge magneto-optical driver. Half-bridge magneto-optical driver C 810 is a single-ended version of full-bridge magneto-optical driver A 710. Half-bridge magneto-optical driver C 810 may include a voltage supply ($V_{DD}$) coupled to a node N1 via a switch 812. Node N1 may further be coupled to a ground voltage supply ($V_{SS}$) via a switch 814. A transmission line (TL) 822 may be coupled between node N1 and node N2. Another transmission line (TL) 832 may be coupled between node N3 and the ground terminal. A resistor 824 and a modulator (MO) 830 may be coupled in series between node N2 and node N3. In this example, each of the transmission lines models the presence of the modulator connection to the driver. By opening and closing the switches the supply voltages may be switched back and forth. As the voltage is switched back and forth over the modulator, the current follows. The current may be coupled to a layer of a magneto-optical material included as part of MO 830 to provide similar functionality as magneto-optical modulator 150 of FIG. 1.

With continued reference to FIG. 8, half-bridge magneto-optical driver D 850 is also a single-ended version of full-bridge magneto-optical driver A 710. With half-bridge magneto-optical driver D 850, the current waveform is optimized using a passive filter, such that the receiver experiences less difficulty sampling the modulated signal. Half-bridge magneto-optical driver D 850 has a voltage supply ($V_{DD}$) coupled to a node N5 via a switch 852. Node N5 may further be coupled to a ground voltage supply ($V_{SS}$) via a switch 854. A transmission line (TL) 872 may be coupled between node N5 and node N6. A filter 856 (e.g., a passive filter) may be coupled between node N6 and node N7. In one example, filter 856 may be a 3r-order Bessel low pass filter that is configured to optimize the current waveform. Another transmission line (TL) 862 may be coupled between node N8 and the ground terminal. A modulator (MO) 860 may be coupled between node N7 and node N8. In this example, each of the transmission lines models the presence of the modulator connection to the driver. By opening and closing the switches the supply voltages may be switched back and forth. As the voltage is switched back and forth over the modulator, the current follows. The current may be coupled to a layer of a magneto-optical material included as part of MO 860 to provide similar functionality as magneto-optical modulator 150 of FIG. 1. Although FIG. 8 shows half-bridge magneto-optical drivers 810 and 850 as including a certain number of components arranged in a certain manner, each of these drivers may include additional or fewer components arranged differently.

Figure 9:
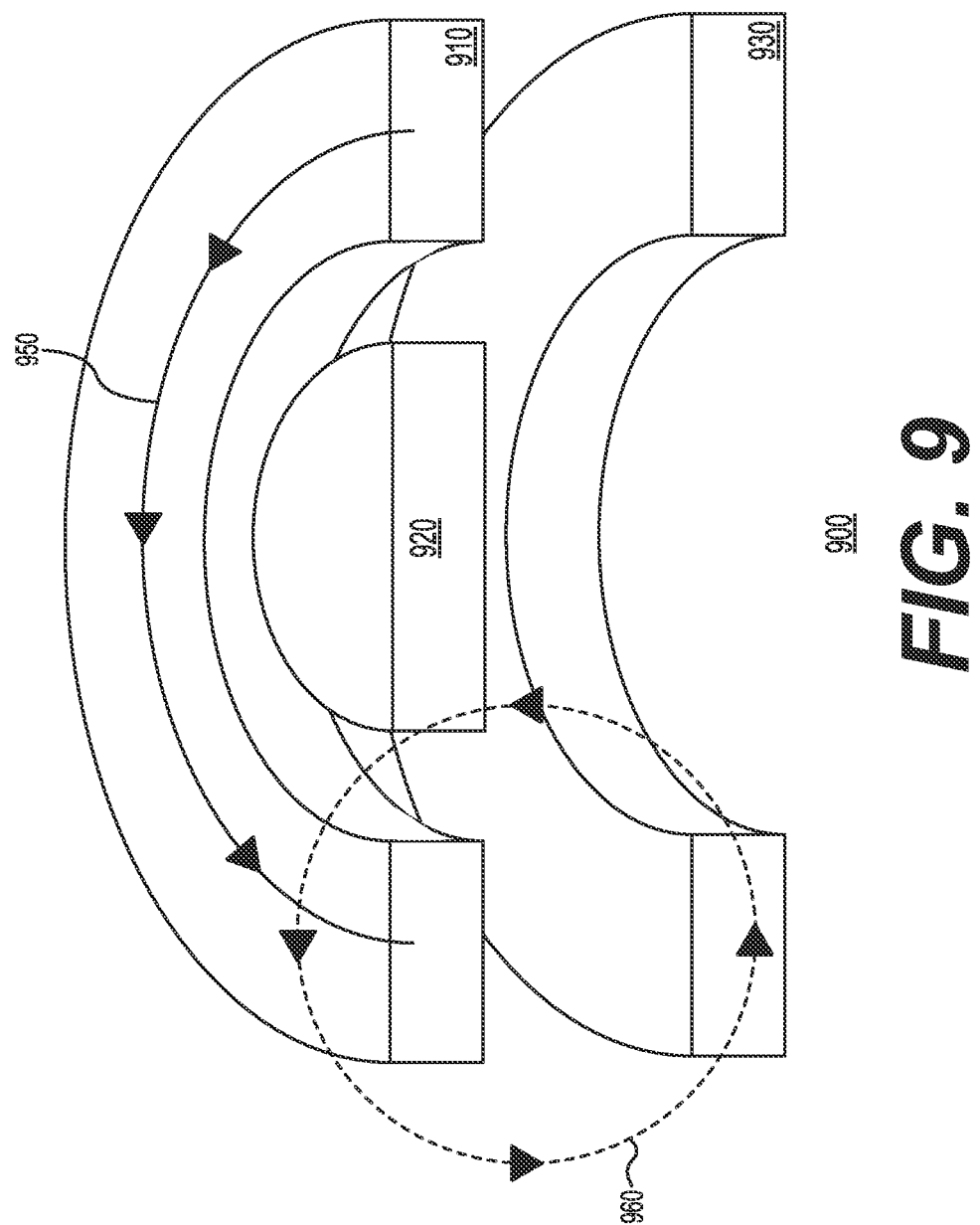
FIG. 9 shows an example modulator structure for use as part of a magneto-optical modulator.

As explained earlier, magneto-optical modulators (e.g., magneto-optical modulator 150) operate by using current to generate a magnetic field that interacts with light propagating through an optical waveguide in such a way to modulate the light. The energy consumed in this process can be reduced by using structures that improve the efficiency by reducing the current requirements for the generation of an appropriate amount of the magnetic field. FIG. 9 shows an example modulator structure 900 for use as part of a magneto-optical modulator that improves the efficiency of magneto-optical modulators. Modulator structure 900 is a Micro-Ring Modulator (MRR) type of structure. Modulator structure 900 increases an amount of the magnetic field generated in response to the current flowing through the conductor (e.g., inductive coils described earlier) by adding a ferromagnetic material in the core of the conductor. In this example, conductor 910, used to carry the current as part of modulator structure 900, may include a magnetic core 920. Magnetic core 920 may comprise a magnetic material with a high magnetic permeability used to confine and guide magnetic fields in electromagnets. The magnetic material may be a ferromagnetic metal such as iron, or ferrimagnetic compounds, such as ferrites. Modulator structure 900 may further include an optical waveguide 930. As shown in FIG. 9, current 950 flowing through conductor 910 generates a magnetic field 960, which in turn alters at least one property of the light propagating through optical waveguide 930. In this example, the use of magnetic core 920 may increase the strength of magnetic field 960 by a factor of several hundred times. Although FIG. 9 shows modulator structure 900 as including a certain number of components arranged in a certain manner, modulator structure 900 may include additional or fewer components arranged differently. As an example, although FIG. 9 shows modulator structure 900 implemented as a Micro-Ring Resonator (MRR) structure, the techniques used to improve the efficiency of modulator structure 900 may also be used for other types of magneto-optical modulators such as Mach-Zehnder Interferometers (MZIs).

Figure 10:
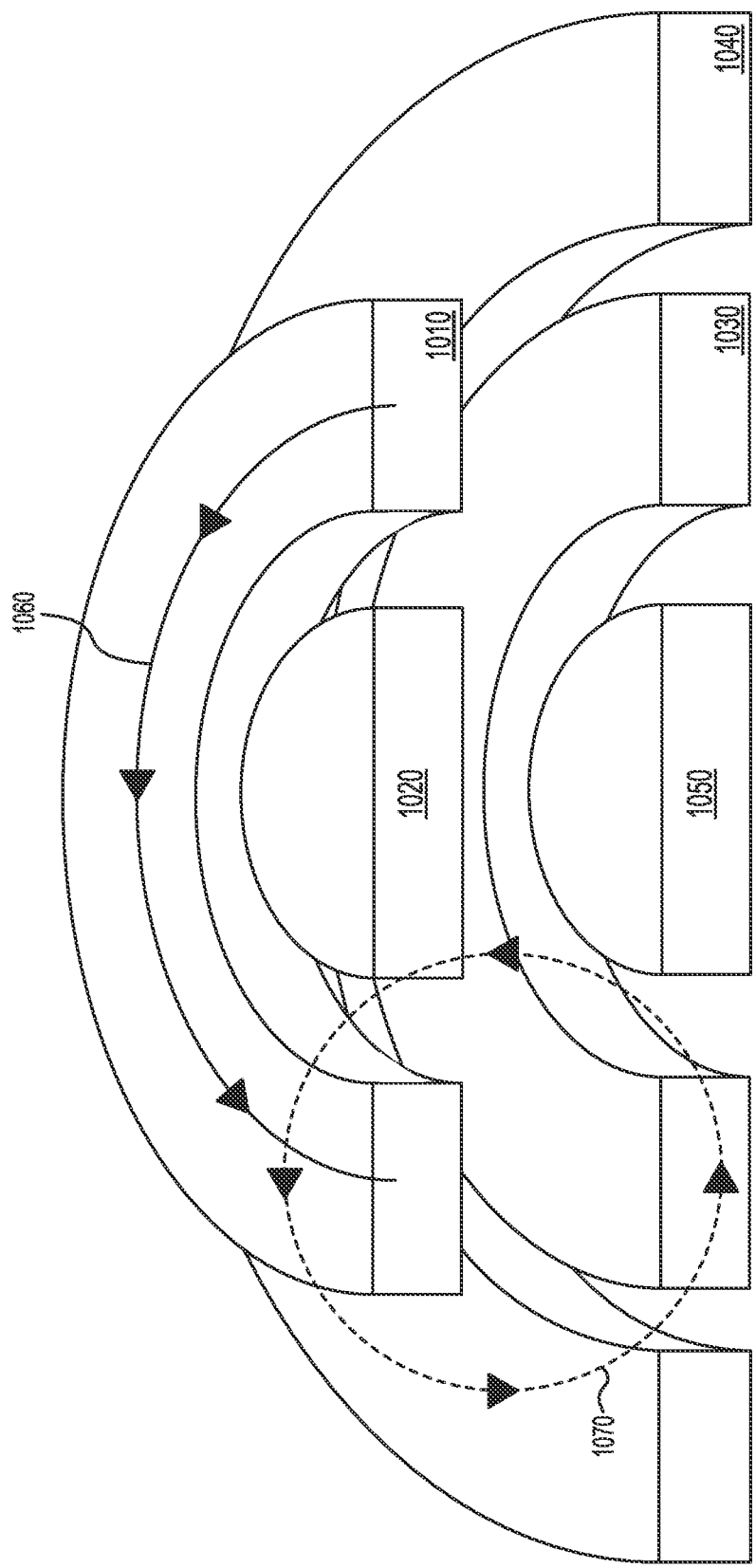
FIG. 10 shows another example modulator structure for use as part of a magneto-optical modulator.

FIG. 10 shows another example modulator structure 1000 for use as part of a magneto-optical modulator that improves the efficiency of magneto-optical modulators. Modulator structure 1000 is also a Micro-Ring Modulator (MRR) type of structure. Modulator structure 1000 increases an amount of the magnetic field generated in response to the current flowing through the conductor (e.g., inductive coils described earlier) by not only adding a ferromagnetic material in the core of the conductor, but also by providing additional ferromagnetic materials in the vicinity of the optical waveguide. In this example, conductor 1010, used to carry the current as part of modulator structure 1000, may include a magnetic core 1020. Modulator structure 1000 may further include an optical waveguide 1030. Another magnetic structure 1040 may be arranged in the vicinity of optical waveguide 1030 (e.g., in a space immediately next to an outside edge of optical waveguide 1030). Yet another magnetic structure 1050 may be arranged in the vicinity of optical waveguide 1030 (e.g., in a space immediately next to an inside edge of optical waveguide 1030). Each of magnetic core 1020, magnetic structure 1040, and magnetic structure 1050 may comprise a magnetic material with a high magnetic permeability used to confine and guide magnetic fields in electromagnets. The magnetic material may be a ferromagnetic metal such as iron, or ferrimagnetic compounds, such as ferrites. As shown in FIG. 10, current 1060 flowing through conductor 1010 generates a magnetic field 1070, which in turn alters at least one property of the light propagating through optical waveguide 1030. In this example, the use of magnetic core 1020, magnetic structure 1040, and magnetic structure 1050 may increase the strength of magnetic field 1070 even more than an increase of magnetic field 960 in modulator structure 900 of FIG. 9. Although FIG. 10 shows modulator structure 1000 as including a certain number of components arranged in a certain manner, modulator structure 1000 may include additional or fewer components arranged differently. As an example, although FIG. 10 shows modulator structure 1000 implemented as a Micro-Ring Resonator (MRR) structure, the techniques used to improve the efficiency of modulator structure 1000 may also be used for other types of magneto-optical modulators, such as Mach-Zehnder Interferometers (MZIs).

Although the above description refers to quantum information, the systems described herein can be implemented to support any service or application that can be offered via a combination of computing, networking, and storage resources, such as via a data center or other infrastructure for delivering a service or an application. The described aspects can also be implemented in cloud computing environments. Cloud computing may refer to a model for enabling on-demand network access to a shared pool of configurable computing resources. For example, cloud computing can be employed in the marketplace to offer ubiquitous and convenient on-demand access to the shared pool of configurable computing resources. A cloud computing model can be composed of various characteristics such as, for example, on-demand self-service, broad network access, resource pooling, rapid elasticity, measured service, and so forth. A cloud computing model may be used to expose various service models, such as, for example, Hardware as a Service ("HaaS"), Software as a Service ("SaaS"), Platform as a Service ("PaaS"), and Infrastructure as a Service ("IaaS"). A cloud computing model can also be deployed using different deployment models such as private cloud, community cloud, public cloud, hybrid cloud, and so forth.

In conclusion, in one aspect, the present disclosure relates to a system including a quantum information system configured to provide a signal corresponding to at least one qubit. The system may further include a magneto-optical driver configured to receive the signal corresponding to the at least one qubit and process the signal to generate a current based on the signal corresponding to the at least one qubit. The system may further include a magneto-optical modulator configured to receive the current from the magneto-optical driver and provide a modulated light output by modulating a received light input based on the current.

The magneto-optical modulator may comprise a modulator structure having a magneto-optical material with an optical property changeable based on a magnetic field generated by the current. The modulator structure may be implemented as one of a Mach-Zehnder Interferometer (MZI) or a Micro-Ring Resonator (MRR).

The magneto-optical driver may comprise a direct current (DC)-powered magneto-optical driver having a superconducting quantum interference device (SQUID) implemented using damped Josephson junctions. The magneto-optical driver may comprise an alternating current (AC)-powered magneto-optical driver having a superconducting quantum interference device (SQUID) implemented using Josephson junctions. The magneto-optical driver may comprise a half-bridge driver or a full-bridge driver.

The system may further include a light detector configured to receive the modulated light output. The quantum information system may be configured to operate at a temperature below 6 Kelvin, and the light detector may be configured to operate at a temperature above 77 Kelvin.

In another aspect, the present disclosure relates to a system including a quantum information system configured to provide a signal corresponding to at least one qubit, where the quantum information system is configured to operate at a temperature below 6 Kelvin and in an environment having a low pressure in a range between $10^{-3}$ Torr to $10^{-10}$ Torr. The system may further include a magneto-optical driver configured to receive the signal corresponding to at least one qubit and process the signal to generate a current based on the signal corresponding to the at least one qubit. The system may further include a magneto-optical modulator configured to receive the current from the magneto-optical driver and provide a modulated light output by modulating a received light input based on the current. The system may further include a light detector coupled to receive the modulated light output.

The magneto-optical modulator may comprise a modulator structure having a magneto-optical material with an optical property changeable based on a magnetic field generated by the current. The modulator structure may be implemented as one of a Mach-Zehnder Interferometer (MZI) or a Micro-Ring Resonator (MRR).

The magneto-optical driver may comprise a direct current (DC)-powered magneto-optical driver having a superconducting quantum interference device (SQUID) implemented using damped Josephson junctions. The magneto-optical driver may comprise an alternating current (AC)-powered magneto-optical driver having a superconducting quantum interference device (SQUID) implemented using Josephson junctions. The magneto-optical driver may comprise a half-bridge driver or a full-bridge driver.

In yet another aspect, the present disclosure relates to a system including a magneto-optical driver configured to receive a signal corresponding to at least one qubit and process the signal to generate a current based on the signal corresponding to the at least one qubit. The system may further include a magneto-optical modulator configured to receive the current from the magneto-optical driver and provide a modulated light output by modulating a received light input based on the current. The system may further include a light detector coupled to receive the modulated light output.

The magneto-optical modulator may comprise a modulator structure having a magneto-optical material with an optical property changeable based on a magnetic field generated by the current. The modulator structure may be implemented as one of a Mach-Zehnder Interferometer (MZI) or a Micro-Ring Resonator (MRR).

The magneto-optical modulator may comprise a modulator structure having a conductor for carrying the current, where the conductor may comprise a magnetic core configured to enhance a magnetic field generated by the current. The modulator structure may further comprise an optical waveguide, and the modulator structure may further comprise at least one magnetic structure, arranged next to the optical waveguide, configured to further enhance the magnetic field generated by the current.

The magneto-optical driver may comprise a driver selected from among at least one of a direct current (DC)-powered magneto-optical driver having a superconducting quantum interference device (SQUID) implemented using damped Josephson junctions, an alternating current (AC)-powered magneto-optical driver having a superconducting quantum interference device (SQUID) implemented using Josephson junctions, a half-bridge driver, or a full-bridge driver.

It is to be understood that the methods, modules, and components depicted herein are merely exemplary. For example, and without limitation, illustrative types of superconducting devices may include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc.

In addition, in an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

Furthermore, those skilled in the art will recognize that boundaries between the functionality of the above-described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:
1. A system comprising:
a quantum information system configured to provide a signal corresponding to at least one qubit;
a magneto-optical driver configured to receive the signal corresponding to the at least one qubit and process the signal to generate a current based on the signal corresponding to the at least one qubit; and a magneto-optical modulator configured to receive the current from the magneto-optical driver and provide a modulated light output by modulating a received light input based on the current wherein the magneto-optical modulator comprises a modulator structure including: (1) an optical waveguide for propagating at least some of the received light input, (2) at least one magnetic structure, and (3) a conductor having a magnetic core, wherein each of the magnetic core of the conductor and the at least one magnetic structure is configured to enhance the magnetic field generated by the current.

2. The system of claim 1, wherein the modulator structure comprises a magneto-optical material with an optical property changeable based on the magnetic field generated by the current.

3. The system of claim 2, wherein the modulator structure is implemented as one of a Mach-Zehnder Interferometer (MZI) or a Micro-Ring Resonator (MRR).

4. The system of claim 1, wherein the magneto-optical driver comprises a direct current (DC)-powered magneto-optical driver having a superconducting quantum interference device (SQUID) implemented using damped Josephson junctions.

5. The system of claim 1, wherein the magneto-optical driver comprises an alternating current (AC)-powered magneto-optical driver having a superconducting quantum interference device (SQUID) implemented using Josephson junctions.

6. The system of claim 1, wherein the magneto-optical driver comprises a half-bridge driver or a full-bridge driver.

7. The system of claim 1, further comprising a light detector configured to receive the modulated light, wherein the modulator structure further comprises another magnetic structure, arranged next to the optical waveguide.

8. The system of claim 7, wherein: (1) the quantum information system is configured to operate at a temperature below 6 Kelvin, and (2) the light detector is configured to operate at a temperature above 77 Kelvin.

9. A system comprising:
a quantum information system configured to provide a signal corresponding to at least one qubit, wherein the quantum information system is configured to operate at a temperature below 6 Kelvin and in an environment having a low pressure in a range between $10^{-3}$ Torr to $10^{-10}$ Torr;
a magneto-optical driver configured to receive the signal corresponding to at least one qubit and process the signal to generate a current based on the signal corresponding to the at least one qubit,
a magneto-optical modulator configured to receive the current from the magneto-optical driver and provide a modulated light output by modulating a received light input based on the current, wherein the magneto-optical modulator comprises a modulator structure including:
(1) an optical waveguide for propagating at least some of the received light input, (2) at least one magnetic structure, and (3) a conductor having a magnetic core, wherein each of the magnetic core of the conductor and the at least one magnetic structure is configured to enhance the magnetic field generated by the current; and
a light detector coupled to receive the modulated light output.

10. The system of claim 9, wherein the modulator structure comprises a magneto-optical material with an optical property changeable based on the magnetic field generated by the current.

11. The system of claim 10, wherein the modulator structure is implemented as one of a Mach-Zehnder Interferometer (MZI) or a Micro-Ring Resonator (MRR).

12. The system of claim 9, wherein the magneto-optical driver comprises a direct current (DC)-powered magneto-optical driver having a superconducting quantum interference device (SQUID) implemented using damped Josephson junctions.

13. The system of claim 9, wherein the magneto-optical driver comprises an alternating current (AC)-powered magneto-optical driver having a superconducting quantum interference device (SQUID) implemented using Josephson junctions.

14. The system of claim 9, wherein the magneto-optical driver comprises a half-bridge driver or a full-bridge driver.

15. A system comprising:
a magneto-optical driver configured to receive a signal corresponding to at least one qubit and process the signal to generate a current based on the signal corresponding to the at least one qubit;
a magneto-optical modulator configured to receive the current from the magneto-optical driver and provide a modulated light output by modulating a received light input based on the current, wherein the magneto-optical modulator comprises a modulator structure including:
(1) an optical waveguide for propagating at least some of the received light input, (2) at least one magnetic structure, and (3) a conductor having a magnetic core, wherein each of the magnetic core of the conductor and the at least one magnetic structure is configured to enhance the magnetic field generated by the current; and
a light detector coupled to receive the modulated light output.

16. The system of claim 15, wherein the modulator structure comprises a magneto-optical material with an optical property changeable based on the magnetic field generated by the current.

17. The system of claim 15, wherein the modulator structure is implemented as one of a Mach-Zehnder Interferometer (MZI) or a Micro-Ring Resonator (MRR).

18. The system of claim 16, wherein the modulator structure further comprises another magnetic structure, arranged next to the optical waveguide.

19. The system of claim 18, wherein: (1) the at least one qubit is configured to operate at a temperature below 6 Kelvin, and (2) the light detector is configured to operate at a temperature above 77 Kelvin.

20. The system of claim 15, wherein the magneto-optical driver comprises a driver selected from among at least one of a direct current (DC)-powered magneto-optical driver having a superconducting quantum interference device (SQUID) implemented using damped Josephson junctions, an alternating current (AC)-powered magneto-optical driver having a superconducting quantum interference device (SQUID) implemented using Josephson junctions, a half-bridge driver, or a full-bridge driver.

* * * * *